United States Patent
Kim et al.

(10) Patent No.: US 10,991,640 B2
(45) Date of Patent: Apr. 27, 2021

(54) SEMICONDUCTOR PACKAGES INCLUDING BRIDGE DIE

(71) Applicant: SK hynix Inc., Icheon-si (KR)

(72) Inventors: Jong Hoon Kim, Suwon-si (KR); Ki Bum Kim, Icheon-si (KR); Bok Kyu Choi, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/545,896

(22) Filed: Aug. 20, 2019

(65) Prior Publication Data

US 2020/0243422 A1 Jul. 30, 2020

(30) Foreign Application Priority Data

Jan. 25, 2019 (KR) .................. 10-2019-0009634

(51) Int. Cl.
| | |
|---|---|
| *H01L 25/065* | (2006.01) |
| *H01L 23/498* | (2006.01) |
| *H01L 23/48* | (2006.01) |
| *H01L 23/52* | (2006.01) |
| *H01L 29/40* | (2006.01) |
| *H01L 23/538* | (2006.01) |
| *H01L 23/31* | (2006.01) |
| *H01L 23/00* | (2006.01) |

(52) U.S. Cl.
CPC ........ *H01L 23/481* (2013.01); *H01L 23/3107* (2013.01); *H01L 24/09* (2013.01); *H01L 24/17* (2013.01); *H01L 2224/02372* (2013.01)

(58) Field of Classification Search
CPC ............ H01L 23/36; H01L 23/5385; H01L 23/49811; H01L 25/0652; H01L 25/0655; H01L 24/14
See application file for complete search history.

(56) References Cited

U.S. PATENT DOCUMENTS

| | | | |
|---|---|---|---|
| 9,941,253 B1 | 4/2018 | Jung et al. | |
| 2011/0024888 A1* | 2/2011 | Pagaila | H01L 25/0657 257/686 |
| 2014/0048928 A1* | 2/2014 | Li | H01L 23/49811 257/737 |
| 2019/0035758 A1* | 1/2019 | Hwang | H01L 23/5383 |

FOREIGN PATENT DOCUMENTS

| | | |
|---|---|---|
| KR | 101236798 B1 | 2/2013 |
| KR | 1020180030147 A | 3/2018 |

* cited by examiner

*Primary Examiner* — Brian Turner
(74) *Attorney, Agent, or Firm* — William Park & Associates Ltd.

(57) ABSTRACT

A semiconductor package includes a first semiconductor die and a stack of second semiconductor dies disposed on a package substrate. The semiconductor package further includes a first bridge die having first through vias that electrically connect the first semiconductor die to the package substrate, a second bridge die having second through vias that electrically connect the stack of the second semiconductor dies to the package substrate, and a third semiconductor die disposed to overlap with the first semiconductor die and the stack of the second semiconductor dies. Moreover, the semiconductor package further includes redistribution lines electrically connecting the third semiconductor die to the second bridge die.

11 Claims, 6 Drawing Sheets

FIG. 7

SEMICONDUCTOR PACKAGES INCLUDING BRIDGE DIE

CROSS-REFERENCE TO RELATED APPLICATIONS

The present application claims priority under 35 U.S.C 119(a) to Korean Application No. 10-2019-0009634, filed on Jan. 25, 2019, which is incorporated herein by references in its entirety.

BACKGROUND

1. Technical Field

The present disclosure relates to semiconductor package technologies and, more particularly, to semiconductor packages including a bridge die.

2. Related Art

Recently, a lot of effort has been made to integrate a plurality of semiconductor dies into a single semiconductor package. That is, attempts to increase package integration density have been made to realize high performance semiconductor packages that process a large amount of data at a high speed with a multi-functional operation. For example, a system-in-package (SiP) technique may be regarded as an attractive candidate for realizing the high performance semiconductor packages. A silicon interposer may be employed in semiconductor packages to electrically connect a plurality of semiconductor dies to each other. In the SiPs, the silicon interposer has been used to electrically connect a microprocessor die to a memory die.

SUMMARY

According to an embodiment, a semiconductor package includes a first semiconductor die disposed on a package substrate, a stack of second semiconductor dies disposed on the package substrate to be spaced apart from the first semiconductor die, a first bridge die including first through vias that electrically connect the first semiconductor die to the package substrate, a second bridge die including second through vias that electrically connect the stack of the second semiconductor dies to the package substrate, a third semiconductor die disposed to overlap with the first semiconductor die and the stack of the second semiconductor dies, first inner connectors electrically connecting the first semiconductor die to the third semiconductor die, second inner connectors electrically connecting the stack of the second semiconductor dies to the third semiconductor die, and redistribution lines disposed to electrically connect the third semiconductor die to the second bridge die.

According to another embodiment, a semiconductor package includes a first semiconductor die disposed on a package substrate, a stack of second semiconductor dies disposed on the package substrate to be spaced apart from the first semiconductor die, a first bridge die including first through vias that electrically connect the first semiconductor die to the package substrate, a second bridge die including second through vias that electrically connect the stack of the second semiconductor dies to the package substrate, a supporting die disposed to overlap with the first semiconductor die and the stack of the second semiconductor dies, conductive patterns disposed on a surface of the supporting die, first inner connectors electrically connecting the first semiconductor die to the conductive patterns, and second inner connectors electrically connecting the stack of the second semiconductor dies to the conductive patterns.

According to yet another embodiment, a semiconductor package includes a first semiconductor die disposed on a package substrate, a second semiconductor die disposed on the package substrate to be spaced apart from the first semiconductor die, a first bridge die including first through vias that electrically connect the first semiconductor die to the package substrate, a second bridge die including second through vias that electrically connect the second semiconductor die to the package substrate, a third semiconductor die disposed to overlap with the first semiconductor die and the second semiconductor die, first inner connectors electrically connecting the first semiconductor die to the third semiconductor die, second inner connectors electrically connecting the second semiconductor die to the third semiconductor die, and redistribution lines disposed to electrically connect the third semiconductor die to the second bridge die.

DETAILED DESCRIPTION OF THE EMBODIMENTS

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be modified in various ways and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. The term "flexible bridge die" or "flexible stack package" means a bridge die or a stack package that warps or bends without any cracks when an external force (or an external stress) is applied to the bridge die or the stack package.

The stack package may correspond to a semiconductor package. The semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 1:
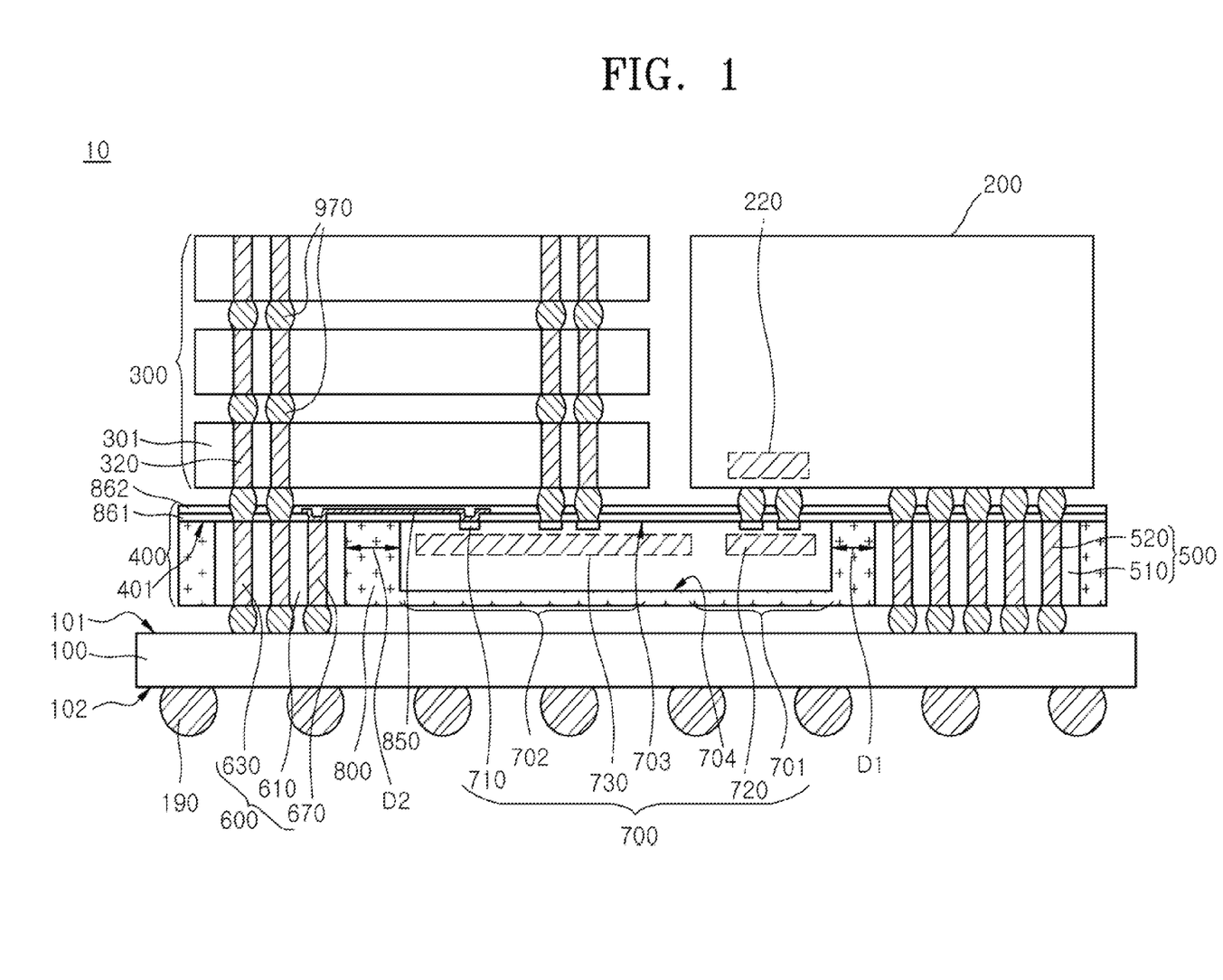
FIG. 1 is a cross-sectional view illustrating a semiconductor package according to an embodiment.

FIG. 1 is a cross-sectional view illustrating a semiconductor package 10 according to an embodiment.

Referring to FIG. 1, the semiconductor package 10 may be configured to include a package substrate 100, a first semiconductor die 200, a stack 300 of second semiconductor dies 301, and a die assembly 400. The die assembly 400 may be configured to include a first bridge die 500, a second bridge die 600, a third semiconductor die 700 and a molding layer 800.

The first semiconductor die 200 may be disposed on a first surface 101 of the package substrate 100. The stack 300 may be disposed on the first surface 101 of the package substrate 100. The stack 300 may be laterally spaced apart from the first semiconductor die 200. The die assembly 400 may be located between the package substrate 100 and the stack 300. The die assembly 400 may also be located between the package substrate 100 and the first semiconductor die 200. That is, the die assembly 400 may be disposed on the first surface 101 of the package substrate 100, and the first semiconductor die 200 and the stack 300 may be disposed side by side on a surface of the die assembly 400, on the opposite side of the die assembly 400 from the side that is in contact with the package substrate 100.

The package substrate 100 may function as an interconnection member for electrically connecting the semiconductor 2wpackage 10 to an external device or another semiconductor module. In an embodiment, the package substrate 100 may be a printed circuit board (PCB). The package substrate 100 may have a second surface 102, which is located at an opposite side of the die assembly 400. Outer connectors 190 may be disposed on the second surface 102 of the package substrate 100 to electrically connect the semiconductor package 10 to an external device or another semiconductor module. The outer connectors 190 may be solder balls.

Figure 2:
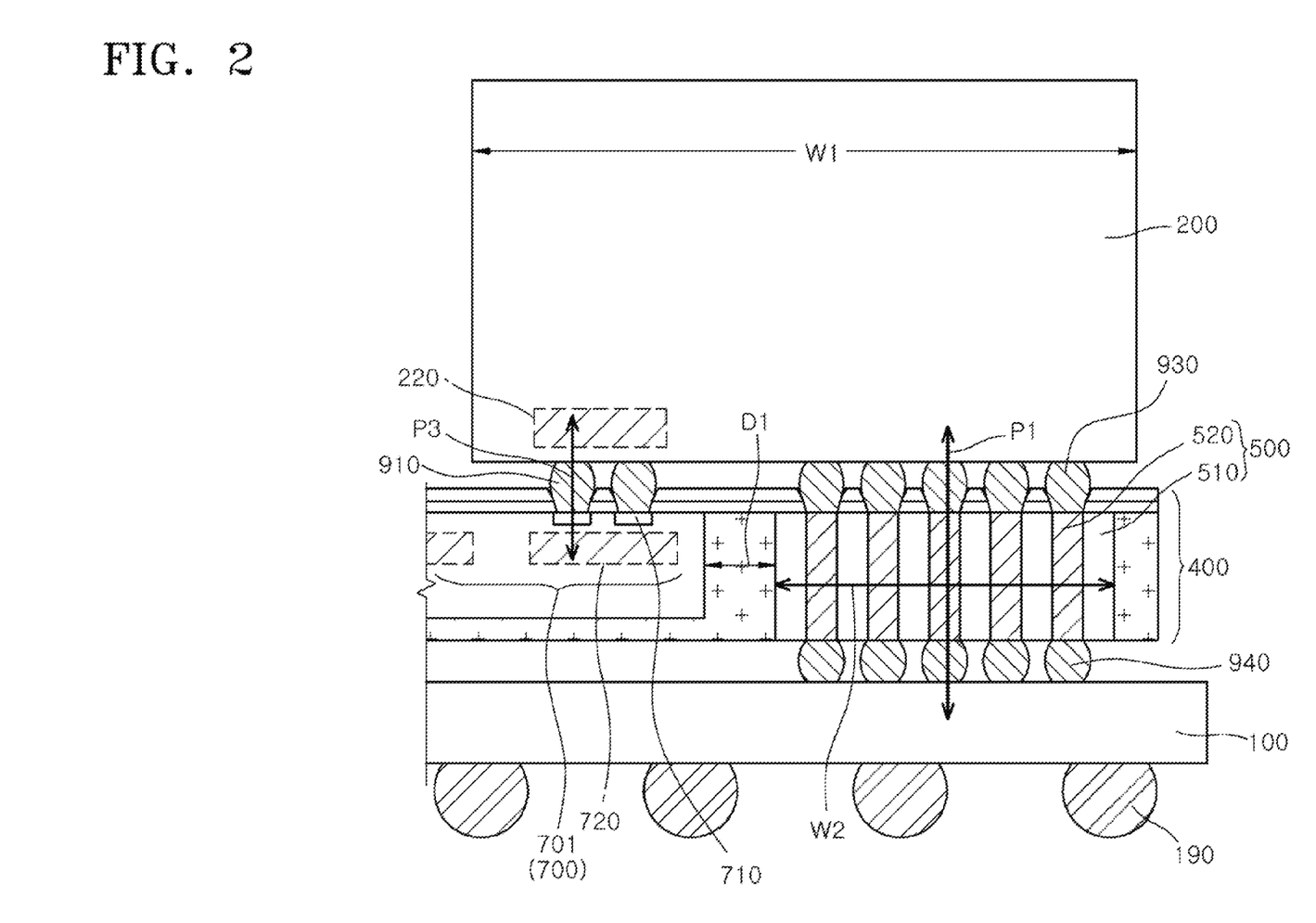
FIG. 2 is an enlarged view of a portion including a first semiconductor die of the semiconductor package shown in FIG. 1.

FIG. 2 is an enlarged cross-sectional view, illustrating a portion including the first semiconductor die 200 of the semiconductor package 10, shown in FIG. 1.

Referring to FIGS. 1 and 2, the first bridge die 500 of the die assembly 400 may be located between the package substrate 100 and the first semiconductor die 200. The first bridge die 500 may overlap with the first semiconductor die 200. The first bridge die 500 may function as an interconnection member for electrically connecting the first semiconductor die 200 to the package substrate 100. The first bridge die 500 may also act as a support, supporting a portion of the first semiconductor die 200.

The first bridge die 500 may be configured to include a first bridge die body 510 and first through vias 520. The first through vias 520 may be formed of a conductive material, vertically penetrating the first bridge die body 510.

The first bridge die body 510 may comprise a semiconductor material, such as a silicon material. If the first bridge die body 510 comprises a silicon material, the first through vias 520 may be formed using a through silicon via (TSV) technique. The first through vias 520 may be formed using a silicon processing technique. Thus, the first through vias 520 may be formed to be conductive vias, having a small size (e.g., a small diameter). For example, the first through vias 520 may be formed to have a diameter of approximately 0.5 micrometers.

The first bridge die body 510 may have a width W2 which is less than a width W1 of the first semiconductor die 200. However, when it is necessary to increase the number of first through vias 520 in order to electrically connect the first semiconductor die 200 to the package substrate 100, it may be possible to increase the number of the first through vias 520 by forming the first through vias 520 using the TSV technique. Accordingly, the first bridge die 500 may provide sufficient amounts of the first through vias 520, acting as the vertical electrical paths for electrically connecting the first semiconductor die 200 to the package substrate 100.

The first through vias 520 may be formed of a conductive metal material, for example, a metal material including copper.

The first through vias 520 may be electrically connected to the first semiconductor die 200 through third inner connectors 930. The first through vias 520 may be electrically connected to the package substrate 100 through fourth inner connectors 940. A connection structure including the third inner connectors 930, the first through vias 520 and the fourth inner connectors 940 may provide the first electrical paths P1, corresponding to the vertical paths that electrically and directly connect the first semiconductor die 200 to the package substrate 100. The third inner connectors 930 and the fourth inner connectors 940 may be bumps.

Figure 3:
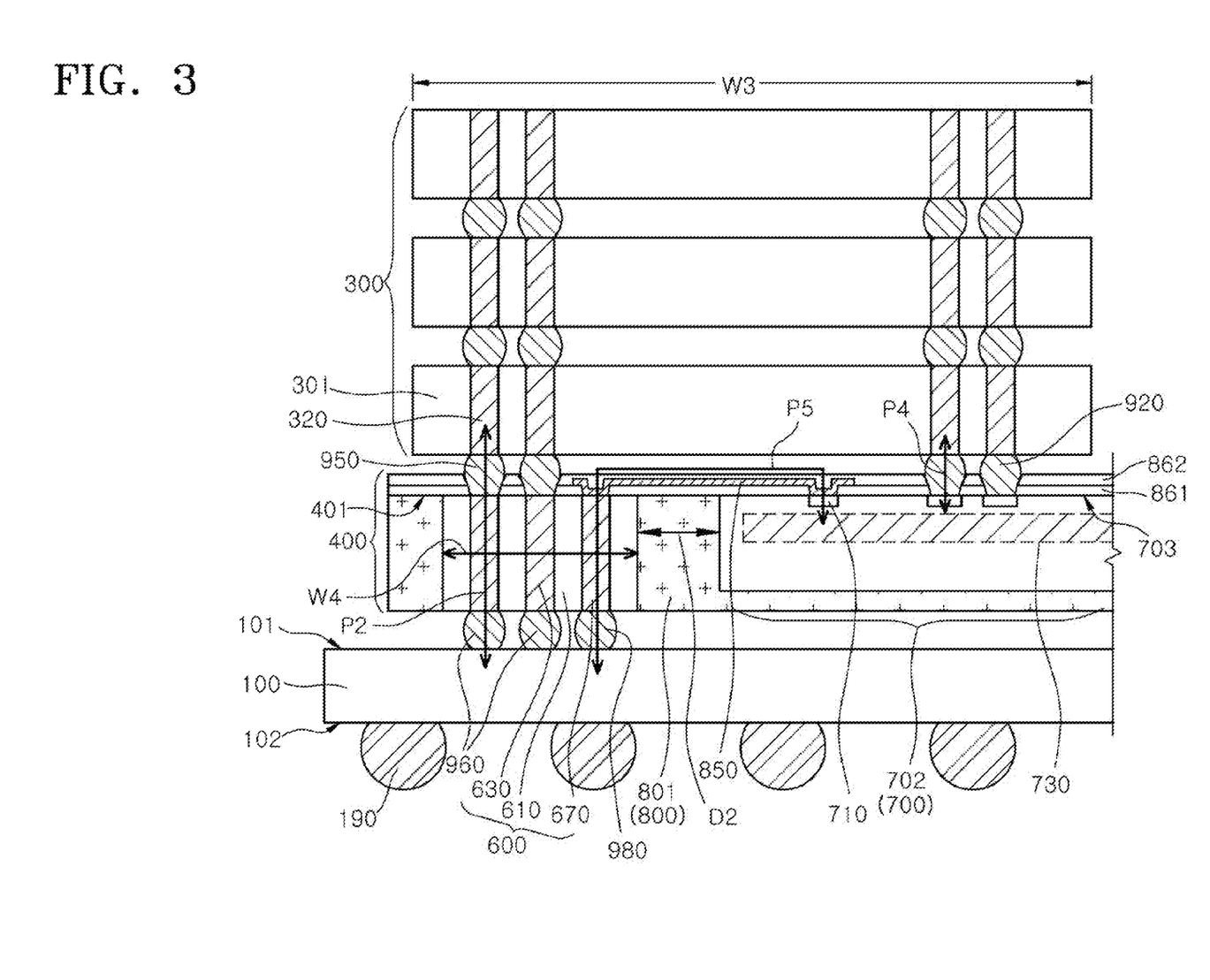
FIG. 3 is an enlarged view of a portion including a stack of second semiconductor dies of the semiconductor package shown in FIG. 1.

FIG. 3 is an enlarged cross-sectional view, illustrating a portion including the stack 300 of the semiconductor package 10, shown in FIG. 1.

Referring to FIG. 3, the second bridge die 600 of the die assembly 400 may be located between the package substrate 100 and the stack 300. The second bridge die 600 may overlap with the stack 300. The second bridge die 600 may function as an interconnection member for electrically connecting the stack 300 to the package substrate 100. The second bridge die 600 may also act as a support, supporting a portion of the stack 300.

The second bridge die 600 may be configured to include a second bridge die body 610, second through vias 630, and third through vias 670. The second through vias 630 may be formed of a conductive material, vertically penetrating the second bridge die body 610.

The second bridge die body 610 may comprise a semiconductor material, such as a silicon material. If the second bridge die body 610 comprises a silicon material, the second through vias 630 may be formed using a through silicon via (TSV) technique. Thus, the second through vias 630 may be formed to be conductive vias having a small size (e.g., a small diameter).

The second bridge die body 610 may have a width W4 which is less than a width W3 of the stack 300. However, when it is necessary to increase the number of second through vias 630 in order to electrically connect the second semiconductor dies 301 to the package substrate 100, it may be possible to increase the number of the second through vias 630, by forming the second through vias 630 using the TSV technique. Accordingly, the second bridge die 600 may provide sufficient amounts of the second through vias 630 acting as the vertical electrical paths for electrically connecting the stack 300 to the package substrate 100.

The second through vias 630 may be electrically connected to the stack 300 through fifth inner connectors 950. The second through vias 630 may be electrically connected to the package substrate 100 through sixth inner connectors 960. A connection structure including the fifth inner connectors 950, the second through vias 630 and the sixth inner connectors 960 may provide the second electrical paths P2, corresponding to the vertical paths that electrically and directly connect the stack 300 to the package substrate 100. The third inner connectors 930 and the fourth inner connectors 940 may be bumps.

Referring again to FIG. 1, the third semiconductor die 700 may be disposed between the first bridge die 500 and the second bridge die 600. One portion of the third semiconductor die 700 may overlap with a portion of the stack 300, and another portion of the third semiconductor die 700 may overlap with a portion of the first semiconductor die 200. That is, the third semiconductor die 700 may include a portion 701, overlapping with the first semiconductor die 200, and a portion 702, overlapping with the stack 300. The third semiconductor die 700 may be disposed such that the portion 701 is located between the first semiconductor die 200 and the package substrate 100 and the portion 702 is located between the stack 300 and the package substrate 100.

The third semiconductor die 700 may have a first surface 703 and a second surface 704 which are opposite of each other. The third semiconductor die 700 may be disposed such that the first surface 703 faces the first semiconductor die 200 and the stack 300, and the second surface 704 faces the package substrate 100. Conductive connection pads 710 may be disposed on the first surface 703 of the third semiconductor die 700.

The third semiconductor die 700 may also include a second interfacial region 720 which is disposed in the portion 701, and the second interfacial region 720 may include a physical layer PHY. The third semiconductor die 700 may further include a circuit region 730 in which integrated circuits, for controlling the second semiconductor dies 301, are formed. The second semiconductor dies 301 may correspond to slave dies, controlled by the third semiconductor die 700, and the third semiconductor die 700 may correspond to a master die.

The stack 300 may be formed by vertically stacking the second semiconductor dies 301. The second semiconductor dies 301 may be memory semiconductor dies, such as dynamic random access memory (DRAM) devices. The second semiconductor dies 301 may be electrically connected to each other by seventh inner connectors 970. Each of the second semiconductor dies 301 may include fourth through vias 320, which are electrically connected to some of the seventh inner connectors 970. The second semiconductor dies 301 may be electrically connected to each other through the seventh inner connectors 970 and the fourth through vias 320. The fourth through vias 320 may be formed using the TSV technique.

Referring again to FIG. 2, the third semiconductor die 700 may be disposed such that the portion 701 overlaps with the first semiconductor die 200. The first semiconductor die 200 may include a first interfacial region 220 overlapping with the third semiconductor die 700. The first interfacial region 220 may include integrated circuits for communicating with the third semiconductor die 700. That is, a physical layer PHY for communicating with the third semiconductor die 700 may be disposed in the first interfacial region 220. The first semiconductor die 200 may be disposed such that the first interfacial region 220 overlaps with the second interfacial region 720.

The first semiconductor die 200 may be electrically connected to the third semiconductor die 700 through first inner connectors 910. The first inner connectors 910 may be disposed on the portion 701 of the third semiconductor die 700, which overlaps with the first semiconductor die 200. The first inner connectors 910 may overlap with the first interfacial region 220 and the second interfacial region 720. The first inner connectors 910 may provide the third electrical paths P3 that electrically connect the first semiconductor die 200 to the third semiconductor die 700.

Since the first inner connectors 910 are located between the first semiconductor die 200 and the third semiconductor die 700, vertical lengths of the third electrical paths P3 may be significantly reduced. Thus, due to the decrease in distance of the electrical path, a data transmission speed between the first interfacial region 220 and the second interfacial region 720 may be improved to enhance the performance of the semiconductor package 10.

Referring again to FIG. 3, the third semiconductor die 700 may be disposed such that the portion 702 overlaps with the stack 300. The stack 300 may be electrically connected to the third semiconductor die 700 through second inner connectors 920. The second inner connectors 920 may be located on the portion 702 of the third semiconductor die 700, which overlaps with the stack 300. The second inner connectors 920 may provide the fourth electrical paths P4 that electrically connect the third semiconductor die 700 to the stack 300.

Since the second inner connectors 920 are located between the third semiconductor die 700 and the stack 300, vertical lengths of the fourth electrical paths P4 may be significantly reduced. Thus, due to the decrease in distance of the electrical path, a data transmission speed between the third semiconductor die 700 and the stack 300 may be improved to enhance the performance of the semiconductor package 10.

Referring again to FIG. 1, the molding layer 800 may embed the first and second bridge dies 500 and 600 and the third semiconductor die 700 therein. The molding layer 800 may surround and hold the first and second bridge dies 500 and 600 and the third semiconductor die 700 in place, thereby acting as a component of the die assembly 400. The molding layer 800 may extend to fill a space D1 between the first bridge die 500 and the third semiconductor die 700. The molding layer 800 may also extend to fill a space D2 between the second bridge die 600 and the third semiconductor die 700. The molding layer 800 may act as a base layer that binds and holds the first and second bridge dies 500 and 600 and the third semiconductor die 700 in place. The molding layer 800 may be formed of any one of various encapsulant materials. For example, the molding layer 800 may be formed of an epoxy molding compound (EMC) material. The molding layer 800 may extend to cover the second surface 704 of the third semiconductor die 700 while revealing the first surface 703 of the third semiconductor die 700.

Referring to FIG. 3, the die assembly 400 may further include redistribution lines 850 that electrically connect the second bridge die 600 to the third semiconductor die 700. The redistribution lines 850 may be conductive line patterns having first ends located on the third semiconductor die 700 and second ends located on the second bridge die 600. Therefore, each of the redistribution lines 850 may extend from a portion of the third semiconductor die 700 to a portion of the second bridge die 600. The redistribution lines 850 may be disposed on a portion 801 of the molding layer 800, which fills the space D2 between the second bridge die 600 and the third semiconductor die 700.

The redistribution lines 850 may extend such that the first ends of the redistribution lines 850 are connected to the connection pads 710 of the third semiconductor die 700 and the second ends of the redistribution lines 850 are connected to third through vias 670 of the second bridge die 600. The third through vias 670 of the second bridge die 600 may be electrically coupled to the redistribution lines 850 to electrically connect the third semiconductor die 700 to the package substrate 100. The third through vias 670 may be electrically connected to the package substrate 100 through eighth inner connectors 980. The third through vias 670 may be formed to have substantially the same shape as the second through vias 630. The eighth inner connectors 980 may be bumps having substantially the same shape as the sixth inner connectors 960.

The redistribution lines 850, the third through vias 670 and the eighth inner connectors 980 may provide the fifth electrical paths P5 that electrically connect the third semiconductor die 700 to the package substrate 100. Because of the configuration of the fifth electrical paths P5, the third semiconductor die 700 may be electrically connected to the package substrate 100 without any extra connection members. For example, the embodiment might not require through silicon vias (TSVs) penetrating a body of the third semiconductor die 700.

A first dielectric layer 861 and a second dielectric layer 862 may be sequentially formed on a surface 401 of the die assembly 400. The first dielectric layer 861 and the second dielectric layer 862 may be formed to protect the redistribution lines 850 and to electrically insulate the redistribution lines 850 from each other.

The die assembly 400 may support the first semiconductor die 200 and the stack 300 and may electrically connect the first semiconductor die 200 and the stack 300 to the package substrate 100. The die assembly 400 may be provided by forming the molding layer 800 for binding and holding the first and second bridge dies 500 and 600 and the third semiconductor die 700 in place. As a result, the semiconductor package 10 may be provided using the die assembly 400 without using any interconnection structure such as a silicon interposer.

Figure 4:
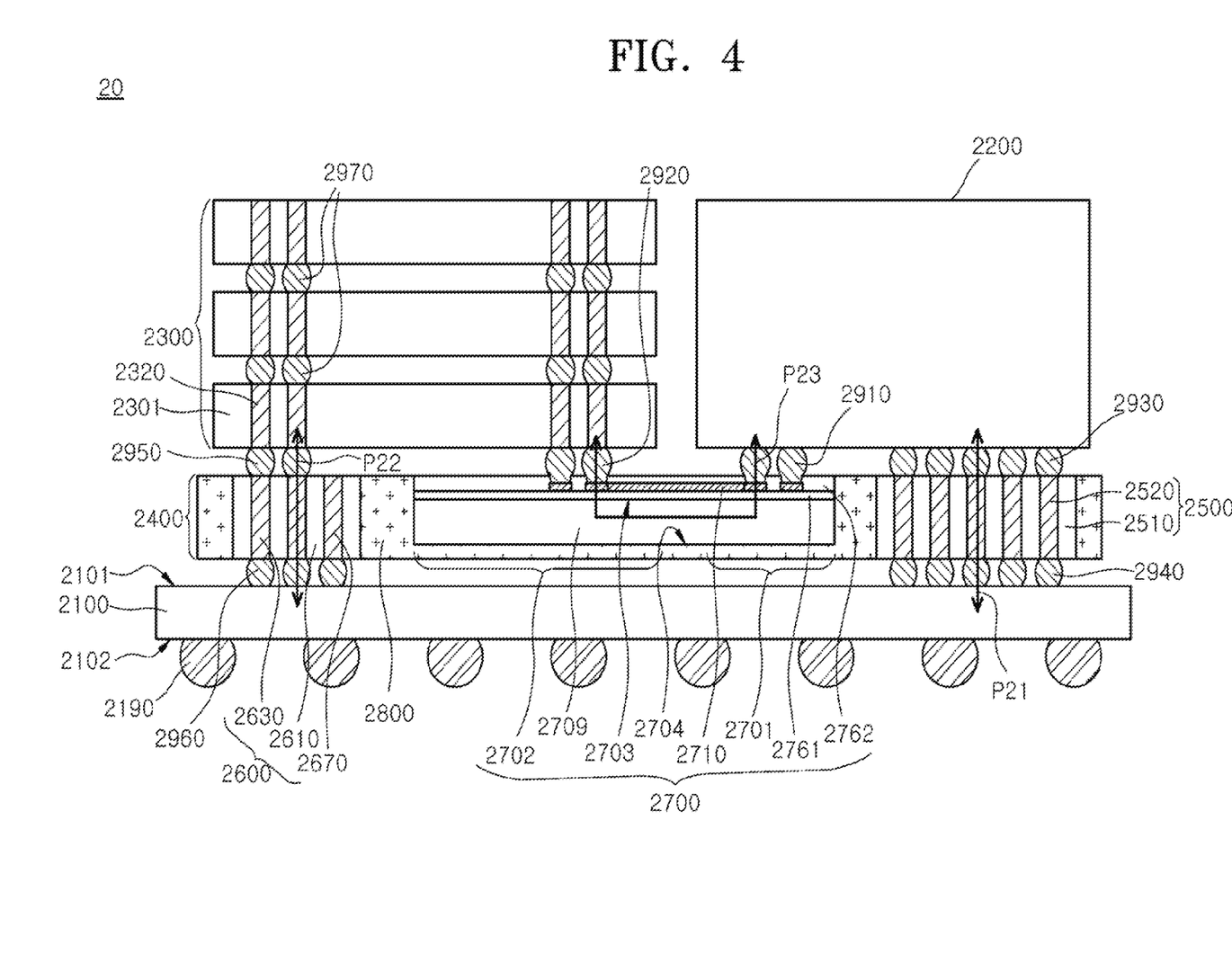
FIG. 4 is a cross-sectional view illustrating a semiconductor package according to another embodiment.

FIG. 4 is a cross-sectional view, illustrating a semiconductor package 20, according to another embodiment.

Referring to FIG. 4, the semiconductor package 20 may be configured to include a package substrate 2100, a first semiconductor die 2200, a stack 2300 of second semiconductor dies 2301, and a die assembly 2400. The die assembly 2400 may be configured to include a first bridge die 2500, a second bridge die 2600, a supporting die 2700 and a molding layer 2800.

The first semiconductor die 2200 may be disposed on a first surface 2101 of the package substrate 2100. The stack 2300 of the second semiconductor dies 2301 may be disposed on the first surface 2101 of the package substrate 2100. The stack 2300 may be laterally spaced apart from the first semiconductor die 2200. The die assembly 2400 may be located between the package substrate 2100 and the stack 2300. The die assembly 2400 may also be located between the package substrate 2100 and the first semiconductor die 2200. That is, the die assembly 2400 may be disposed on the first surface 2101 of the package substrate 2100, and the first semiconductor die 2200 and the stack 2300 may be disposed side by side on a surface of the die assembly 2400, the surface opposite of the one in contact with the package substrate 2100.

Outer connectors 2190 may be disposed on a second surface 2102 of the package substrate 2100, the surface opposite of the one in contact with the die assembly 2400, to electrically connect the semiconductor package 20 to an external device or another semiconductor module.

The first bridge die 2500 of the die assembly 2400 may be located between the package substrate 2100 and the first semiconductor die 2200. The first bridge die 2500 may overlap with the first semiconductor die 2200. The first bridge die 2500 may be configured to include a first bridge die body 2510 and first through vias 2520. The first through vias 2520 may be formed of a conductive material, vertically penetrating the first bridge die body 2510. The first bridge die body 2510 may comprise a semiconductor material such as a silicon material. If the first bridge die body 2510 comprises a silicon material, the first through vias 2520 may be formed using a through silicon via (TSV) technique.

The first through vias 2520 may be electrically connected to the first semiconductor die 2200 through third inner connectors 2930. The first through vias 2520 may be electrically connected to the package substrate 2100 through fourth inner connectors 2940. A connection structure, including the third inner connectors 2930, the first through vias 2520 and the fourth inner connectors 2940, may provide the first electrical paths P21 corresponding to vertical paths that electrically and directly connect the first semiconductor die 2200 to the package substrate 2100.

The second bridge die 2600 of the die assembly 2400 may be located between the package substrate 2100 and the stack 2300. The second bridge die 2600 may overlap with the stack 2300. The second bridge die 2600 may be configured to include a second bridge die body 2610 and second through vias 2630. The second through vias 2630 may be formed of a conductive material, vertically penetrating the second bridge die body 2610. The second bridge die body 2610 may comprise a semiconductor material such as a silicon material. If the second bridge die body 2610 comprises a silicon material, the second through vias 2630 may be formed using a through silicon via (TSV) technique.

The second through vias 2630 may be electrically connected to the stack 2300 through fifth inner connectors 2950. The second through vias 2630 may be electrically connected to the package substrate 2100 through sixth inner connectors 2960. A connection structure including the fifth inner connectors 2950, the second through vias 2630 and the sixth inner connectors 2960 may provide the second electrical paths P22 corresponding to vertical paths that electrically and directly connect the stack 2300 to the package substrate 2100.

The stack 2300 may be formed by vertically stacking the second semiconductor dies 2301. The second semiconductor dies 2301 may be memory semiconductor dies, such as dynamic random access memory (DRAM) devices. The second semiconductor dies 2301 may be electrically connected to each other through seventh inner connectors 2970. Each of the second semiconductor dies 2301 may include third through vias 2320, which are electrically connected to some of the seventh inner connectors 2970. The second semiconductor dies 2301 may be electrically connected to each other through the seventh inner connectors 2970 and the third through vias 2320. The third through vias 2320 may be formed using the TSV technique.

The supporting die 2700 of the die assembly 2400 may be disposed between the first and second bridge dies 2500 and 2600. The supporting die 2700 may overlap with the first semiconductor die 2200 and the stack 2300. A portion 2701 of the supporting die 2700 may overlap with the first semiconductor die 2200, and another portion 2702 of the supporting die 2700 may overlap with the stack 2300. The supporting die 2700 may be disposed such that the portion 2701 is located between the first semiconductor die 2200 and the package substrate 2100 and the portion 2702 is located between the stack 2300 and the package substrate 2100.

The supporting die 2700 may have a first surface 2703 and a second surface 2704 which are opposite of each other. The supporting die 2700 may be disposed such that the first surface 2703 faces the first semiconductor die 2200 and the stack 2300 and the second surface 2704 faces the package substrate 2100. Conductive patterns 2710 may be disposed on the first surface 2703 of the supporting die 2700. The conductive patterns 2710 may be interconnection lines. The conductive patterns 2710 may be metal patterns, for example, copper patterns.

The supporting die 2700 may support the conductive patterns 2710. The supporting die 2700 may comprise a silicon material. The supporting die 2700 may be a dummy die in which no integration circuit exists. Since the supporting die 2700 comprises a silicon material, the conductive patterns 2710 may be formed using a silicon processing technique. Accordingly, the conductive patterns 2710 may be realized to have a fine size.

The supporting die 2700 may be located such that the portion 2701 overlaps with the first semiconductor die 2200. The first semiconductor die 2200 may be electrically connected to the conductive patterns 2710 through first inner connectors 2910. The first inner connectors 2910 may be disposed on the portion 2701 of the supporting die 2700, which overlaps with the first semiconductor die 2200. The supporting die 2700 may be located such that the portion 2702 overlaps with the stack 2300. The stack 2300 may be electrically connected to the conductive patterns 2710 through second inner connectors 2920. The second inner connectors 2920 may be disposed on the portion 2702 of the supporting die 2700, which overlaps with the stack 2300.

The conductive patterns 2710 may be located to overlap with the first inner connectors 2910 and may extend to overlap with the second inner connectors 2920. The conductive patterns 2710 may be interconnection lines that electrically connect the first inner connectors 2910 to the second inner connectors 2920. The first inner connectors 2910, the conductive patterns 2710 and the second inner connectors 2920 may provide the third electrical paths P23 corresponding to horizontal paths that electrically connect the stack 2300 to the first semiconductor die 2200.

A first dielectric layer 2761 may be disposed on the first surface 2703 of the supporting die 2700 to electrically insulate the conductive patterns 2710 from a body 2709 of the supporting die 2700. A second dielectric layer 2762 may be additionally disposed on the first dielectric layer 2761 to electrically insulate the conductive patterns 2710 from each other.

The molding layer 2800 may embed the first and second bridge dies 2500 and 2600 and the supporting die 2700 therein. The molding layer 2800 may surround and fix the first and second bridge dies 2500 and 2600 and the supporting die 2700, thereby acting as a component of the die assembly 2400.

The semiconductor package 20 may be provided by employing the die assembly 2400 even without using any interconnection structure such as a silicon interposer.

Figure 5:
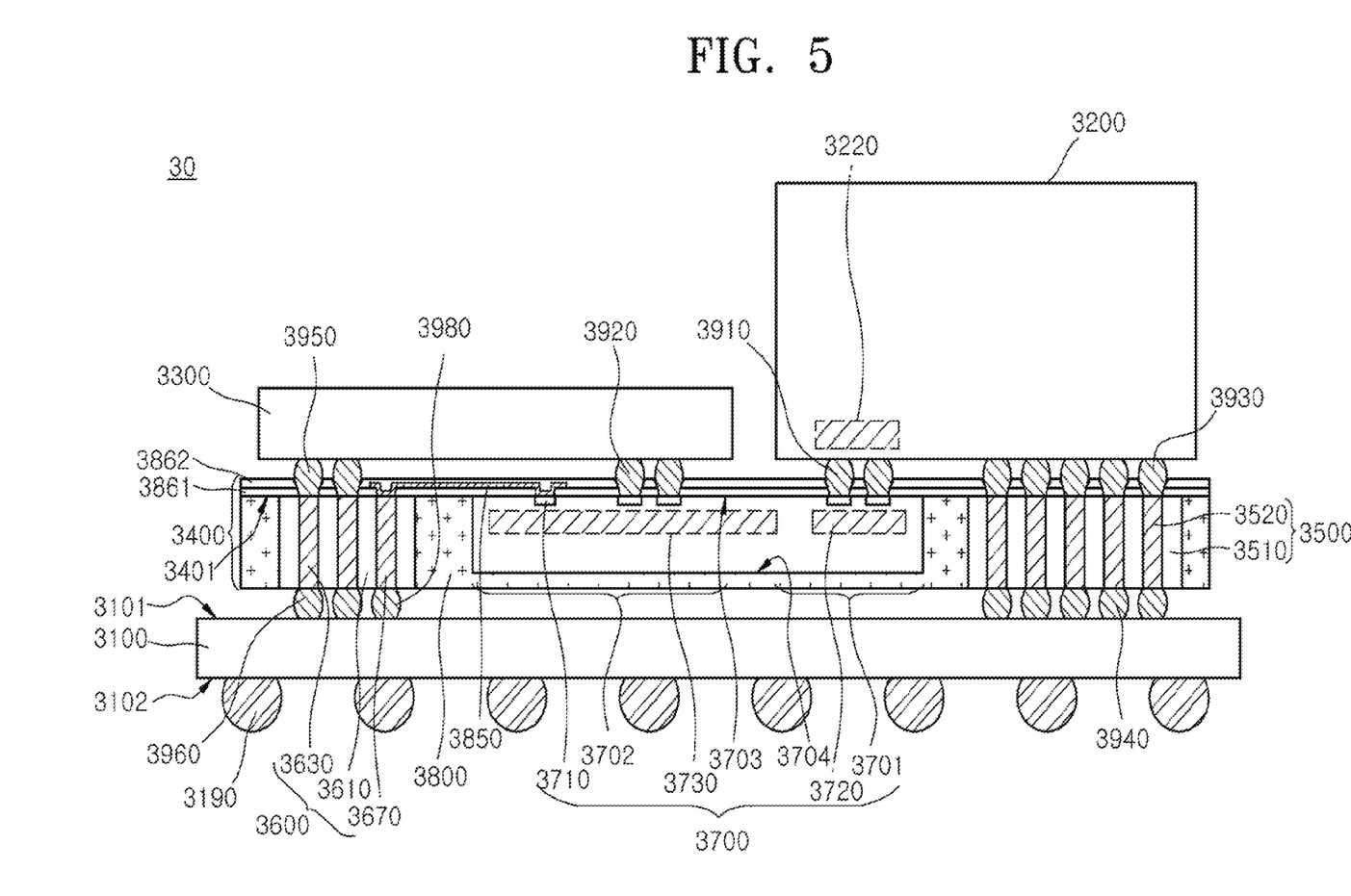
FIG. 5 is a cross-sectional view illustrating a semiconductor package according to yet another embodiment.

FIG. 5 is a cross-sectional view illustrating a semiconductor package 30 according to yet another embodiment.

Referring to FIG. 5, the semiconductor package 30 may be configured to include a package substrate 3100, a first semiconductor die 3200, a second semiconductor die 3300, and a die assembly 3400. The die assembly 3400 may be configured to include a first bridge die 3500, a second bridge die 3600, a third semiconductor die 3700 and a molding layer 3800.

The first semiconductor die 3200 may be disposed on a first surface 3101 of the package substrate 3100. The second semiconductor die 3300 may be disposed on the first surface 3101 of the package substrate 3100. The second semiconductor die 3300 may be laterally spaced apart from the first semiconductor die 3200. The die assembly 3400 may be located between the package substrate 3100 and the second semiconductor die 3300. The die assembly 3400 may also be located between the package substrate 3100 and the first semiconductor die 3200. That is, the die assembly 3400 may be disposed on the first surface 3101 of the package substrate 3100, and the first semiconductor die 3200 and the second semiconductor dies 3300 may be disposed side by side on a surface of the die assembly 3400, the surface opposite of the one in contact with the package substrate 3100. Outer connectors 3190 may be disposed on a second surface 3102 of the package substrate 3100, the surface opposite of the one in contact with the die assembly 3400.

The first bridge die 3500 of the die assembly 3400 may overlap with the first semiconductor die 3200. The first bridge die 3500 may function as an interconnection member for electrically connecting the first semiconductor die 3200 to the package substrate 3100. The first bridge die 3500 may also act as a support, supporting a portion of the first semiconductor die 3200.

The first bridge die 3500 may be configured to include a first bridge die body 3510 and first through vias 3520. The first through vias 3520 may be formed of a conductive material, vertically penetrating the first bridge die body 3510. The first through vias 3520 may be electrically connected to the first semiconductor die 3200 through third inner connectors 3930. The first through vias 3520 may be electrically connected to the package substrate 3100 through fourth inner connectors 3940.

The second bridge die 3600 of the die assembly 3400 may be located between the package substrate 3100 and the second semiconductor die 3300. The second bridge die 3600 may overlap with the second semiconductor die 3300. The second bridge die 3600 may function as an interconnection member for electrically connecting the second semiconductor die 3300 to the package substrate 3100. The second bridge die 3600 may also act as a support, supporting a portion of the second semiconductor die 3300.

The second bridge die 3600 may be configured to include a second bridge die body 3610 and a second through vias 3630. The second through vias 3630 may be formed of a conductive material, vertically penetrating the second bridge die body 3610. The second through vias 3630 may be electrically connected to the second semiconductor die 3300 through fifth inner connectors 3950. The second through vias 3630 may be electrically connected to the package substrate 3100 through sixth inner connectors 3960.

The third semiconductor die 3700 of the die assembly 3400 may be disposed between the first and second bridge dies 3500 and 3600. The third semiconductor die 3700 may overlap with the first semiconductor die 3200 and the second semiconductor die 3300. A portion 3701 of the third semiconductor die 3700 may overlap with the first semiconductor die 3200, and another portion 3702 of the third semiconductor die 3700 may overlap with the second semiconductor die 3300. The third semiconductor die 3700 may be disposed such that the portion 3701 is located between the first semiconductor die 3200 and the package substrate 3100 and the portion 3702 is located between the second semiconductor die 3300 and the package substrate 3100.

The third semiconductor die 3700 may have a first surface 3703 and a second surface 3704 which are opposite of each other. The third semiconductor die 3700 may be disposed such that the first surface 3703 faces the first semiconductor die 3200 and the second semiconductor die 3300 and the second surface 3704 faces the package substrate 3100. Conductive connection pads 3710 may be disposed on the first surface 3703 of the third semiconductor die 3700.

The third semiconductor die 3700 may also include a second interfacial region 3720 which is disposed in the portion 3701, and the second interfacial region 3720 may include a physical layer PHY. The third semiconductor die 3700 may further include a circuit region 3730 in which integrated circuits for controlling the second semiconductor die 3300 are formed. The second semiconductor die 3300 may correspond to a slave die, controlled by the third semiconductor die 3700, and the third semiconductor die 3700 may correspond to a master die. In such a case, no TSV is disposed in the second semiconductor die 3300.

The third semiconductor die 3700 may be located such that the portion 3701, of the third semiconductor die 3700, overlaps with the first semiconductor die 3200. The first semiconductor die 3200 may include a first interfacial region 3220 overlapping with the third semiconductor die 3700. The first interfacial region 3220 may include integrated circuits for communicating with the third semiconductor die 3700. That is, a physical layer PHY for communicating with the third semiconductor die 3700 may be disposed in the first interfacial region 3220. The first semiconductor die 3200 may be disposed such that the first interfacial region 3220 overlaps with the second interfacial region 3720.

The first semiconductor die 3200 may be electrically connected to the third semiconductor die 3700 through first inner connectors 3910. The first inner connectors 3910 may be disposed on the portion 3701 of the third semiconductor die 3700, which overlaps with the first semiconductor die 3200. The first inner connectors 3910 may overlap with the first interfacial region 3220 and the second interfacial region 3720.

The third semiconductor die 3700 may be disposed such that the portion 3702, of the third semiconductor die 3700, overlaps with the second semiconductor die 3300. The second semiconductor die 3300 may be electrically connected to the third semiconductor die 3700 through second inner connectors 3920. The second inner connectors 3920 may be located on the portion 3702 of the third semiconductor die 3700, which overlaps with the second semiconductor die 3300.

The molding layer 3800 may embed the first and second bridge dies 3500 and 3600 and the third semiconductor die 3700 therein. The die assembly 3400 may further include redistribution lines 3850 that electrically connect the second bridge die 3600 to the third semiconductor die 3700.

The redistribution lines 3850 may have first ends connected to the connection pads 3710 of the third semiconductor die 3700 and second ends connected to third through vias 3670 of the second bridge die 3600. The third through vias 3670 of the second bridge die 3600 may be electrically coupled to the redistribution lines 3850 to electrically connect the third semiconductor die 3700 to the package substrate 3100. The third through vias 3670 of the second bridge die 3600 may be electrically connected to the package substrate 3100 through eighth inner connectors 3980. The third through vias 3670 of the second bridge die 3600 may be formed to have substantially the same shape as the second through vias 3630. The eighth inner connectors 3980 may be bumps, having substantially the same shape as the sixth inner connectors 3960.

A first dielectric layer 3861 and a second dielectric layer 3862 may be sequentially formed on a surface 3401 of the die assembly 3400. The first dielectric layer 3861 and the second dielectric layer 3862 may be formed to protect the redistribution lines 3850 and to electrically insulate the redistribution lines 3850 from each other.

Figure 6:
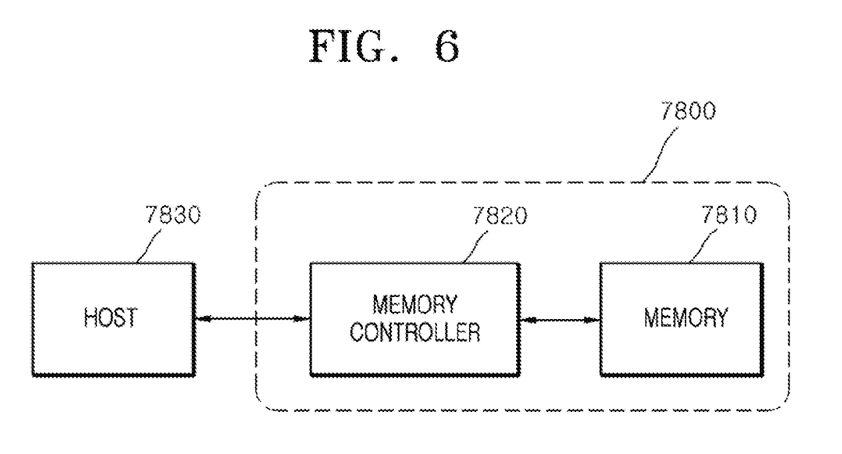
FIG. 6 is a block diagram illustrating an electronic system employing a memory card including a semiconductor package according to an embodiment.

FIG. 6 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 7:
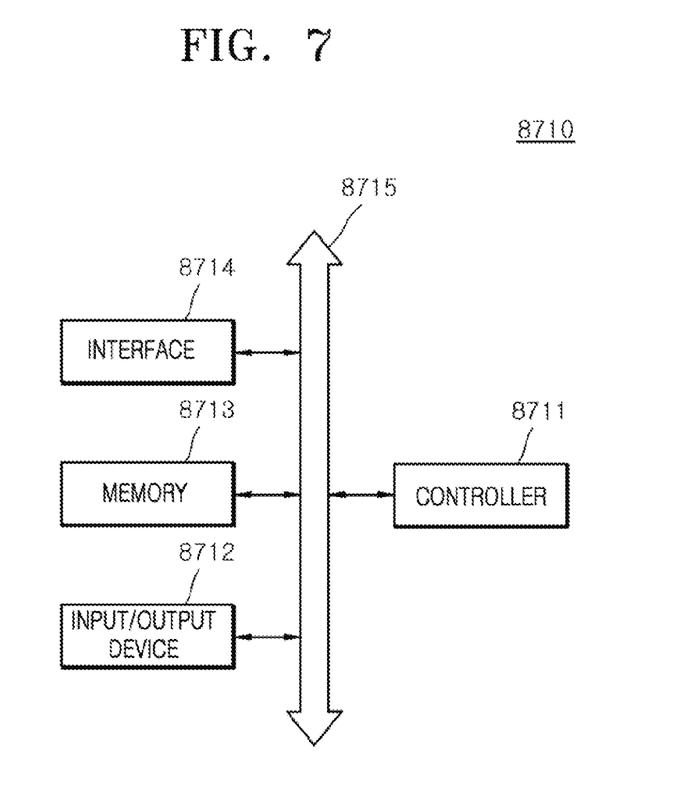
FIG. 7 is a block diagram illustrating another electronic system including a semiconductor package according to an embodiment.

FIG. 7 is a block diagram illustrating an electronic system 8710 including at least one of the semiconductor packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
a first semiconductor die disposed on a package substrate;
a stack of second semiconductor dies disposed on the package substrate to be spaced apart from the first semiconductor die;
a first bridge die including first through vias that electrically connect the first semiconductor die to the package substrate;
a second bridge die including second through vias that electrically connect the stack of the second semiconductor dies to the package substrate;
a third semiconductor die disposed to overlap with the first semiconductor die and the stack of the second semiconductor dies;
first inner connectors electrically connecting the first semiconductor die to the third semiconductor die;
second inner connectors electrically connecting the stack of the second semiconductor dies to the third semiconductor die; and
redistribution lines disposed to electrically connect the third semiconductor die to the second bridge die,
wherein the second bridge die further includes third through vias that are electrically coupled to the redistribution lines to electrically connect the third semiconductor die to the package substrate, and
wherein the redistribution lines extend such that first ends of the redistribution lines are connected to the third semiconductor die and second ends of the redistribution lines are connected to the third through vias.

2. The semiconductor package of claim 1, the semiconductor package further comprising a molding layer in which the first and second bridge dies and the third semiconductor die are embedded.

3. The semiconductor package of claim 2, wherein the redistribution lines are disposed on a portion of the molding layer, which fills a space between the second bridge die and the third semiconductor die, and are disposed to extend onto the second bridge die and the third semiconductor die.

4. The semiconductor package of claim 1, wherein the first bridge die is located between the first semiconductor die and the package substrate to overlap with the first semiconductor die, and wherein the second bridge die is located between the stack of the second semiconductor dies and the package substrate to overlap with the stack of the second semiconductor dies.

5. The semiconductor package of claim 1,
wherein the first bridge die includes a first bridge die body through which the first through vias vertically pass; and
wherein the first bridge die body includes a silicon material.

6. The semiconductor package of claim 1, wherein the third semiconductor die is disposed between the first and second bridge dies.

7. The semiconductor package of claim 1, wherein the third semiconductor die is configured to have a first portion overlapping with the first semiconductor die and a second portion overlapping with the stack of the second semiconductor dies.

8. The semiconductor package of claim 7,
wherein the first inner connectors are disposed on the first portion of the third semiconductor die; and
wherein the second inner connectors are disposed on the second portion of the third semiconductor die.

9. The semiconductor package of claim 1,
wherein the first semiconductor die includes a first interfacial region in which a physical layer for communicating with the third semiconductor die is located; and
wherein the third semiconductor die includes a second interfacial region overlapping with the first interfacial region.

10. The semiconductor package of claim 1,
wherein the second semiconductor dies are vertically stacked and are electrically connected to each other through third through vias.

11. A semiconductor package comprising:
a first semiconductor die disposed on a package substrate;
a second semiconductor die disposed on the package substrate to be spaced apart from the first semiconductor die;
a first bridge die including first through vias that electrically connect the first semiconductor die to the package substrate;
a second bridge die including second through vias that electrically connect the second semiconductor die to the package substrate;
a third semiconductor die disposed to overlap with the first semiconductor die and the second semiconductor die;
a molding layer in which the first and second bridge dies and the third semiconductor die are embedded;
first inner connectors electrically connecting the first semiconductor die to the third semiconductor die;
second inner connectors electrically connecting the second semiconductor die to the third semiconductor die; and
redistribution lines disposed to electrically connect the third semiconductor die to the second bridge die,
wherein the second bridge die further includes third through vias that are electrically coupled to the redistribution lines to electrically connect the third semiconductor die to the package substrate, and
wherein the redistribution lines extend such that first ends of the redistribution lines are connected to the third semiconductor die and second ends of the redistribution lines are connected to the third through vias.

* * * * *